United States Patent
Maruyama (10) Patent No.: US 11,051,433 B2
(45) Date of Patent: Jun. 29, 2021

(54) RECTIFIER OF ROTATING ELECTRIC MACHINE

(71) Applicant: DENSO CORPORATION, Kariya (JP)

(72) Inventor: Toshinori Maruyama, Kariya (JP)

(73) Assignee: DENSO CORPORATION, Kariya (JP)

(*) Notice: Subject to any disclaimer, the term of this patent is extended or adjusted under 35 U.S.C. 154(b) by 134 days.

(21) Appl. No.: 16/244,476

(22) Filed: Jan. 10, 2019

(65) Prior Publication Data

US 2019/0215992 A1   Jul. 11, 2019

(30) Foreign Application Priority Data

Jan. 11, 2018 (JP) .............................. JP2018-002616

(51) Int. Cl.
| | |
|---|---|
| H05K 7/20 | (2006.01) |
| H02K 9/06 | (2006.01) |
| H02K 11/049 | (2016.01) |
| H02K 5/18 | (2006.01) |
| H02K 17/12 | (2006.01) |
| H02K 1/12 | (2006.01) |
| H02K 1/22 | (2006.01) |
| H02K 5/20 | (2006.01) |
| H02K 11/042 | (2016.01) |

(52) U.S. Cl.
CPC .......... *H05K 7/20918* (2013.01); *H02K 1/12* (2013.01); *H02K 1/22* (2013.01); *H02K 5/18* (2013.01); *H02K 5/20* (2013.01); *H02K 9/06* (2013.01); *H02K 11/042* (2013.01); *H02K 11/049* (2016.01); *H02K 17/12* (2013.01)

(58) Field of Classification Search
CPC .... H05K 7/20918; H02K 9/06; H02K 11/049; H02K 5/18; H02K 17/12; H02K 1/12; H02K 1/22; H02K 5/20; H02K 11/042
USPC .................................................. 310/68 D, 71
See application file for complete search history.

(56) References Cited

U.S. PATENT DOCUMENTS

| | | | | |
|---|---|---|---|---|
| 5,892,676 A | * | 4/1999 | Hsieh ..................... | H01L 25/112 363/141 |
| 6,198,187 B1 | * | 3/2001 | Asao ..................... | H02K 11/049 310/68 D |

(Continued)

FOREIGN PATENT DOCUMENTS

| | | |
|---|---|---|
| JP | 2010-017004 A | 1/2010 |
| JP | 2010-074877 A | 4/2010 |
| JP | 2013-110800 A | 6/2013 |

*Primary Examiner* — Ahmed Elnakib
(74) *Attorney, Agent, or Firm* — Oliff PLC (57) ABSTRACT

A rotating electric machine includes a machine main body, a frame member and a rectifier. The machine main body is configured to generate alternating current. The frame member holds the machine main body. The rectifier is provided axially outside the frame member and has a rectification circuit configured to rectify the alternating current generated in the machine main body into direct current. The rectifier includes first and second heat sinks that are located to axially overlap each other, first rectifying elements mounted to the first heat sink and constituting an upper arm of the rectification circuit, and second rectifying elements mounted to the second heat sink and constituting a lower arm of the rectification circuit. The second heat sink is located closer than the first heat sink to the frame member. The surface area of the second heat sink is greater than the surface area of the first heat sink.

5 Claims, 6 Drawing Sheets

(56) References Cited

U.S. PATENT DOCUMENTS

| | | | |
|---|---|---|---|
| 7,570,488 B2 * | 8/2009 | Oohashi | H02K 11/046 |
| | | | 310/60 R |
| 7,605,502 B2 * | 10/2009 | Kondo | H01L 25/115 |
| | | | 310/58 |
| 9,166,461 B2 * | 10/2015 | Ishikawa | H02K 9/22 |
| 2002/0024263 A1 | 2/2002 | Lee | |
| 2003/0141042 A1 * | 7/2003 | Bradfield | H02K 11/046 |
| | | | 165/80.3 |
| 2004/0183385 A1 * | 9/2004 | Takahashi | H01L 23/3737 |
| | | | 310/68 D |
| 2004/0256925 A1 * | 12/2004 | Morrissette | H02K 11/046 |
| | | | 310/68 B |
| 2007/0046114 A1 * | 3/2007 | Kondo | H01L 25/115 |
| | | | 310/68 D |
| 2007/0296289 A1 | 12/2007 | Wolf et al. | |
| 2009/0184601 A1 | 7/2009 | Dubus et al. | |
| 2017/0263516 A1 * | 9/2017 | Ishimaru | H01L 24/01 |

* cited by examiner

FIG.1

FRONT SIDE ←——→ REAR SIDE
AXIAL DIRECTION

RECTIFIER OF ROTATING ELECTRIC MACHINE

CROSS-REFERENCE TO RELATED APPLICATION

This application is based on and claims priority from Japanese Patent Application No. 2018-2616 filed on Jan. 11, 2018, the contents of which are hereby incorporated by reference in their entirety into this application.

BACKGROUND

1 Technical Field

The present disclosure relates to rotating electric machines.

2 Description of Related Art

Conventionally, alternators include rectification circuits that are configured to rectify alternating current generated by the alternators into direct current with which batteries can be charged. Moreover, the rectification circuits generally employ diodes as rectifying elements. However, the rectification by the diodes results in high loss.

To solve the above problem, semiconductor switching elements, such as MOSFETs, may be employed instead of the diodes in the rectification circuits.

For example, Japanese Patent Application Publication No. JP2016058594A discloses a rectifying element (or semiconductor device) which includes a first external electrode having a circular outer peripheral portion, a MOSFET (Metal-Oxide-Semiconductor Field-Effect Transistor) chip arranged on the first external electrode, a control circuit chip, and a second external electrode arranged on the opposite side of the MOSFET chip to the first external electrode.

However, the inventor of the present application has found the following problem with the rectifying element disclosed in the above patent document.

Since the rectifying element includes the MOSFET chip, the maximum operation-guaranteed temperature of the rectifying element (i.e., the highest temperature at which normal operation of the rectifying element is guaranteed) is lower than that of a diode. More specifically, the maximum operation-guaranteed temperature of a diode is generally higher than 200° C. In contrast, the maximum operation-guaranteed temperature of a MOSFET is generally in the range of 150 to 170° C.

On the other hand, during operation of an alternator, the temperature of a frame member, which is arranged adjacent to a rectifying element in the alternator, may be increased to 150° C. or more.

Therefore, in the case of employing the rectifying element that includes the MOSFET chip, it is desirable to improve the heat dissipation efficiency of the rectifying element, thereby suppressing increase in the temperature of the rectifying element.

SUMMARY

According to the present disclosure, there is provided a rotating electric machine which includes a machine main body, a frame member and a rectifier. The machine main body includes a rotor and a stator and is configured to generate alternating current in the stator with rotation of the rotor. The frame member holds the machine main body and is electrically connected to a grounding member. The rectifier is provided axially outside the frame member and has a rectification circuit configured to rectify the alternating current generated in the stator into direct current. The rectifier includes a first heat sink, a second heat sink, a plurality of first rectifying elements and a plurality of second rectifying elements. The first and second heat sinks are located to axially overlap each other. The first rectifying elements are mounted to the first heat sink and constitute an upper arm of the rectification circuit. The second rectifying elements are mounted to the second heat sink and constitute a lower arm of the rectification circuit. Each of the first rectifying elements includes a high-potential base electrode and a first MOSFET. The high-potential base electrode is fixed to the first heat sink and electrically connected to a high-potential side of the upper arm of the rectification circuit. The first MOSFET has a drain electrode provided on the high-potential base electrode without a spacer interposed therebetween. Each of the second rectifying elements includes a ground-potential base electrode and a second MOSFET. The ground-potential base electrode is fixed to the second heat sink and electrically connected to a ground-potential side of the lower arm of the rectification circuit. The second MOSFET has a source electrode provided on the ground-potential base electrode with an electrically-conductive spacer interposed therebetween. The second heat sink is located closer than the first heat sink to the frame member. The surface area of the second heat sink is set to be greater than the surface area of the first heat sink.

In the above rotating electric machine, the rectifying elements that include the MOSFETs are employed, instead of diodes, in the rectification circuit. The maximum operation-guaranteed temperature of the MOSFETs is lower than that of diodes. Therefore, it is desirable to improve the heat dissipation efficiency of the rectifying elements. Moreover, due to the arrangement of the heat sinks and the arrangement of the MOSFETs in the respective rectifying elements, the heat dissipation performance of the second rectifying elements is considered to be lower than the heat dissipation performance of the first rectifying elements. Moreover, the second heat sink is electrically connected to the frame member and thus grounded via the frame member. Accordingly, the second heat sink is located closer than the first heat sink to the frame member. Therefore, the heat dissipation performance of the second heat sink is considered to be lower than the heat dissipation performance of the first heat sink.

Moreover, in each of the rectifying elements, on one of two opposite major faces of the MOSFET, there are provided both the source electrode and a gate electrode; on the other of the two major faces, there is provided the drain electrode. In particular, on that side of the MOSFET where both the source electrode and the gate electrode are provided, the spacer is provided for securing the electrical connection area of the gate electrode. Accordingly, in each of the first rectifying elements, the drain electrode of the first MOSFET is provided on the high-potential base electrode without a spacer interposed therebetween. In contrast, in each of the second rectifying elements, the source electrode of the second MOSFET is provided on the ground-potential base electrode with the electrically-conductive spacer interposed therebetween. Therefore, the heat dissipation performance of the second rectifying elements is considered to be lower than the heat dissipation performance of the first rectifying elements.

In view of the above, according to the present disclosure, the surface area of the second heat sink is set to be greater than the surface area of the first heat sink, thereby improving the heat dissipation efficiency of the second heat sink. Consequently, it becomes possible to effectively dissipate the heat of the second rectifying elements via the second heat sink.

In a further implementation, each of the first and second heat sinks is arc-shaped. The first rectifying elements are arranged in the circumferential direction of the first heat sink. The second rectifying elements are arranged in the circumferential direction of the second heat sink. The radial width of the second heat sink is set to be greater than the radial width of the first heat sink.

More specifically, to prevent interference with a rotating shaft included in the machine main body and secure a sufficient surface area for heat dissipation, each of the heat sinks is arc-shaped. Moreover, the radial width of the second heat sink is set to be greater than the radial width of the first heat sink. Consequently, though the first heat sink and the second heat sink are located to axially overlap each other, it is still possible to secure the heat dissipation area of the second heat sink. Moreover, the surface area of the second heat sink becomes greater than the surface area of the first heat sink. As a result, it is possible to reliably improve the heat dissipation efficiency of the second heat sink.

In a yet further implementation, part of the second heat sink protrudes radially outward from the first heat sink. The radial distance from each of the second rectifying elements to a radially outer edge of the second heat sink is set to be greater than the radial distance from each of the first rectifying elements to a radially outer edge of the first heat sink.

Consequently, it becomes possible to extend that radially outer part of the second heat sink which does not overlap the first heat sink, thereby further improving the heat dissipation efficiency of the second heat sink. In addition, the size of that part of the first heat sink which is located radially outside the first rectifying elements becomes small, thereby avoiding negative consequences such as interference with the second rectifying elements mounted to the second heat sink.

In a still further implementation, the first heat sink has a plurality of heat dissipation ribs formed to protrude radially outward from the radially outer edge of the first heat sink and axially overlap the second heat sink.

Consequently, with the heat dissipation ribs, it becomes possible to reduce the area of the second heat sink shielded by the first heat sink while securing the heat dissipation performance of the first heat sink. Moreover, though the size of that part of the first heat sink which is located radially outside the first rectifying elements becomes small, it is still possible to secure the heat dissipation performance of the first heat sink while preventing the first heat sink from interfering with the second rectifying elements mounted to the second heat sink.

In a yet further implementation, the rotating electric machine further includes a cover arranged on the opposite axial side of the rectifier to the frame member to cover the rectifier. The cover has a plurality of ventilation holes formed therein. The rectifier further includes a terminal block. Each of the second rectifying elements further includes a lead electrode provided on an opposite side of the second MOSFET to the ground-potential base electrode. The terminal block includes a plurality of connection terminals each of which is provided to electrically connect the lead electrode of a corresponding one of the second rectifying elements to the stator. Each of the connection terminals has a cooling part configured to be cooled by cooling air flowing into the rotating electric machine through the ventilation holes formed in the cover.

Consequently, the connection terminals can be cooled by the cooling air, thereby improving the heat dissipation performance thereof. As a result, the heat of the second rectifying elements can be transferred to the corresponding connection terminals via the respective lead electrode. That is, it becomes possible for the heat of the second rectifying elements to be dissipated on the lead electrode side as well as on the ground-potential base electrode side.

DESCRIPTION OF EMBODIMENT

Figure 1:
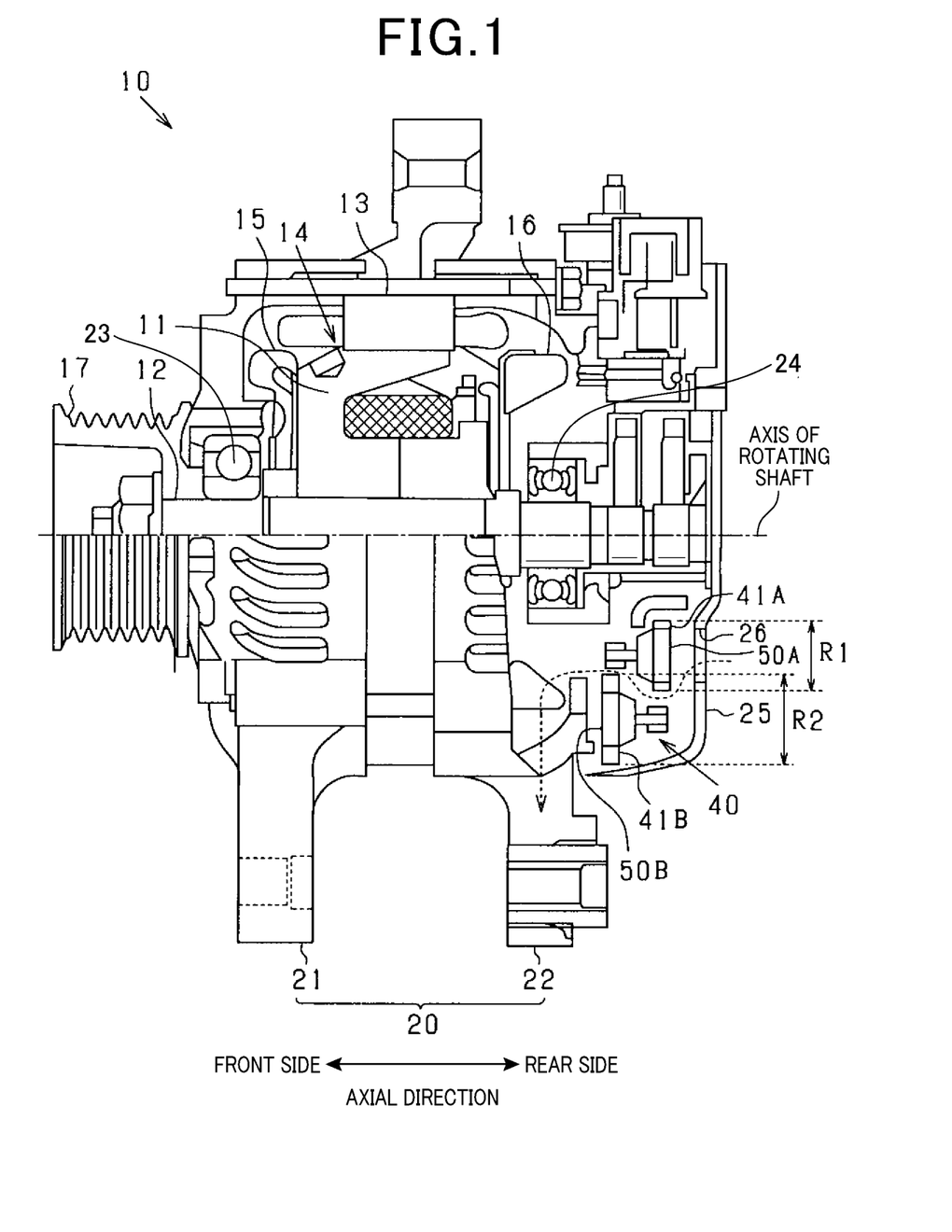
FIG. 1 is a partially cross-sectional view of a rotating electric machine according to an embodiment.

FIG. 1 shows the overall configuration of a rotating electric machine 10 according to an embodiment.

In the present embodiment, the rotating electric machine 10 is configured as an automotive alternator. More specifically, though not shown in the figures, the rotating electric machine 10 is mechanically connected to an output shaft of an engine of a vehicle via a connecting member (e.g., a belt) and driven by torque transmitted from the output shaft of the engine to rotate.

As shown in FIG. 1, the rotating electric machine 10 includes: a machine main body 14 that includes a rotor 11, a rotating shaft 12 and a stator 13 and is configured to generate alternating current in the stator 13 with rotation of the rotor 11; a frame member 20 that holds the machine main body 14; and a rectifier 40 that has rectification circuits 30 formed therein for rectifying the alternating current generated in the stator 13 into direct current.

In the present embodiment, the frame member 20 is composed of a front frame 21 and a rear frame 22 that are aligned in an axial direction of the rotating shaft 12 and joined by a plurality of bolts into one piece. In the frame member 20, there are formed a plurality of heat dissipation holes. Moreover, the frame member 20 is electrically connected to the vehicle body and thus grounded via the vehicle body. In addition, the vehicle body corresponds to a "grounding member" in the claims.

The rotor 11 is fixed on the rotating shaft 12 so as to rotate together with the rotating shaft 12. In the present embodiment, the rotor 11 is configured as a Lundell-type rotor. Specifically, the rotor 11 includes a field coil and a pair of pole cores. The rotor 11 further has a pair of centrifugal-type cooling fans 15 and 16 respectively mounted to opposite axial end faces (or front and rear end faces) of the pole cores.

The rotating shaft 12 is rotatably supported by the frame member 20 via a pair of bearings 23 and 24 provided in the frame member 20. On a front end portion of the rotating shaft 12, there is mounted a pulley 17. In operation, the pulley 17 is driven by the engine of the vehicle via, for example, a belt (not shown) to rotate. Consequently, with rotation of the pulley 17, all of the rotating shaft 12, the rotor 11 and the cooling fans 15 and 16 also rotate.

Figure 3:
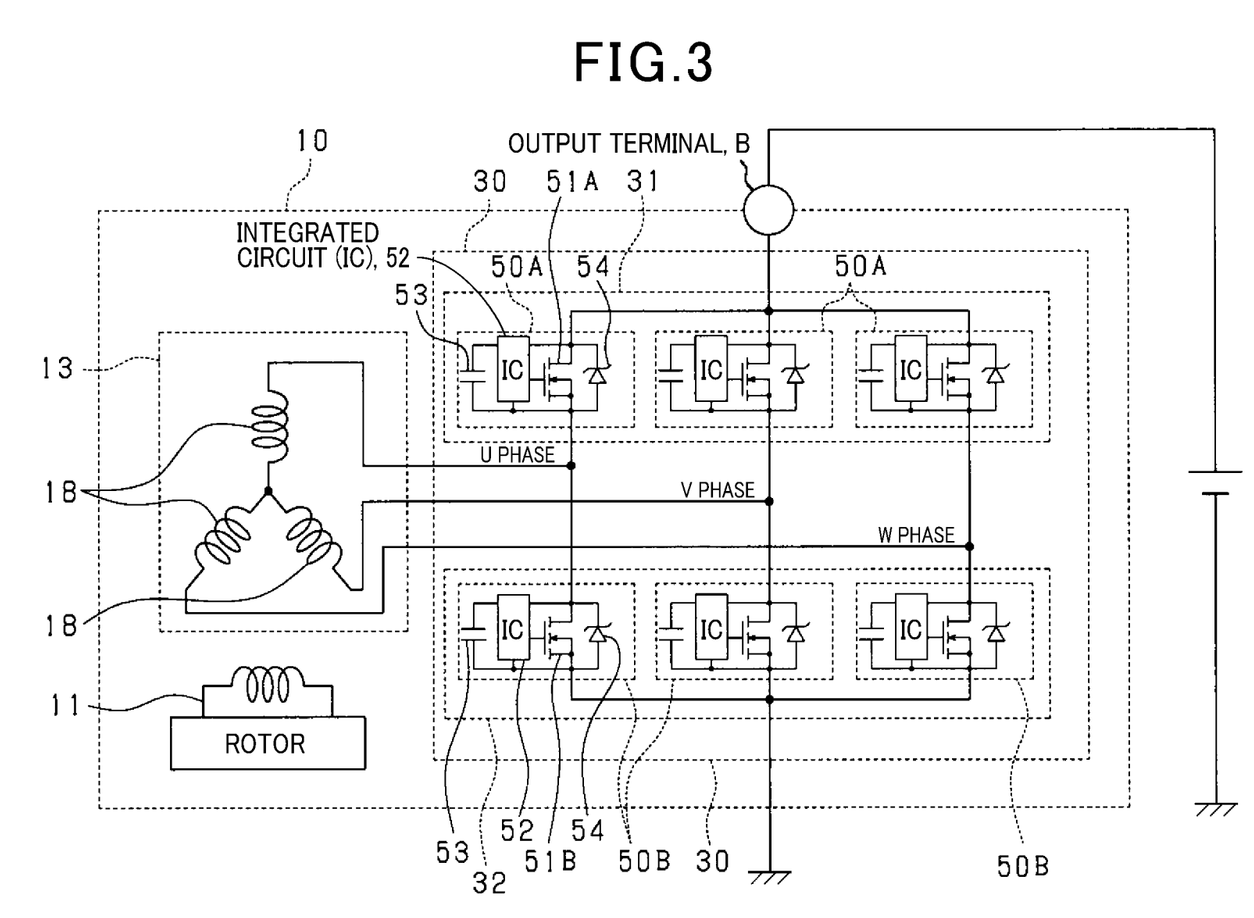
FIG. 3 is a circuit diagram illustrating the configuration of each of rectification circuits formed in the rectifier.

The stator 13 is disposed radially outside the rotor 11 so as to surround the rotor 11. In the present embodiment, the stator 13 includes an annular stator core and a pair of three-phase stator coils 18 wound on the stator core. The stator coils 18 have the same configuration; therefore, only one of the stator coils 18 is shown in FIG. 3. The stator 13 is fixedly sandwiched between the front frame 21 and the rear frame 22.

In addition, it should be noted that the number of phases of the stator coils 18 may alternatively be two, or four or more. It also should be noted that the number of the stator coils 18 included in the stator 13 may alternatively be one, or three or more.

On the outer side of the rear frame 22 (i.e., on the opposite side of the rear frame 22 to the machine main body 14) in the axial direction of the rotating shaft 12, there is mounted a rear cover 25. In a space formed between the rear frame 22 and the rear cover 25, there is received the rectifier 40. In addition, in the space formed between the rear frame 22 and the rear cover 25, there are also received a voltage regulator that regulates the output voltage of the rotating electric machine 10 and a field coil energization mechanism.

Figure 2:
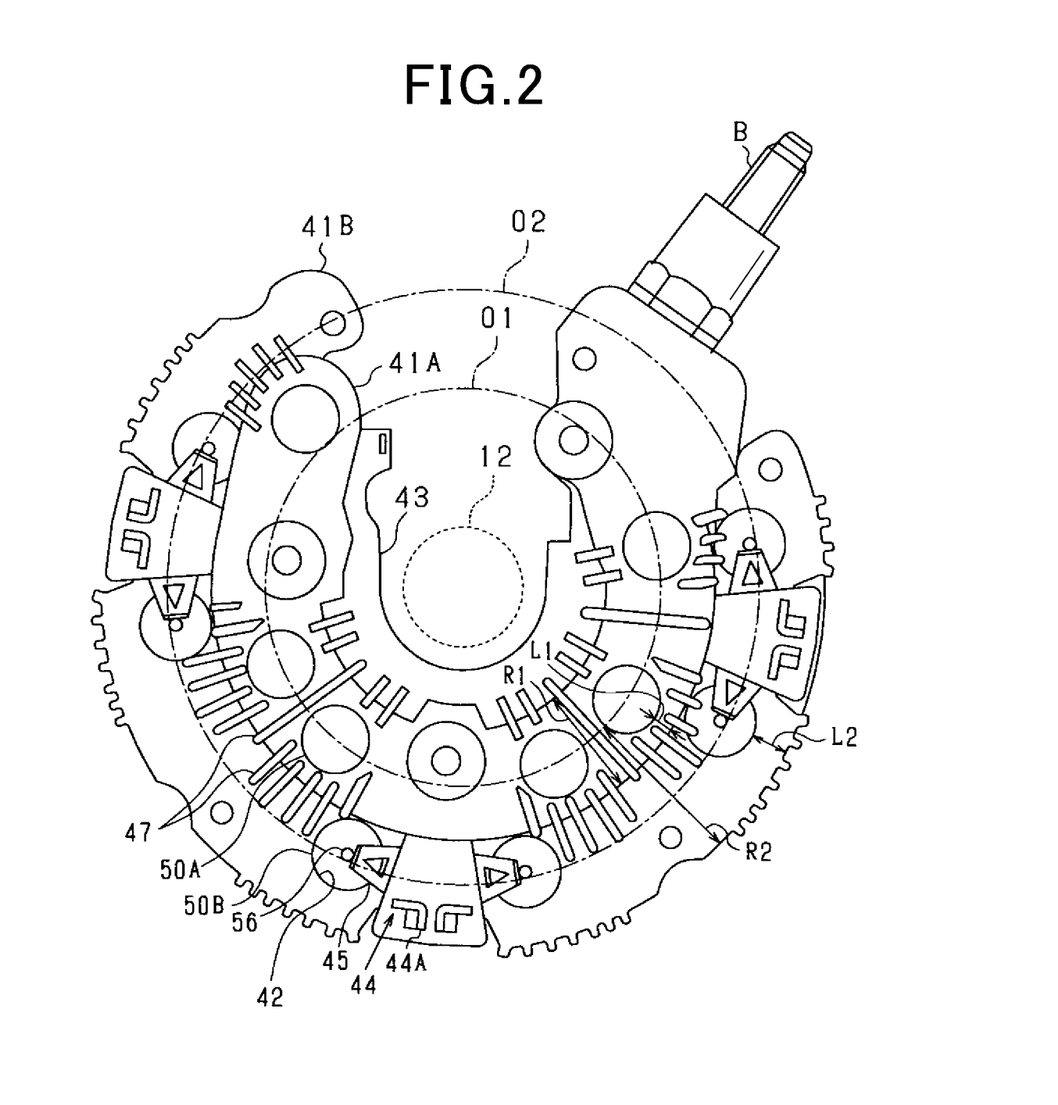
FIG. 2 is a plan view of a rectifier of the rotating electric machine.

The rectifier 40 is provided axially outside the frame member 20. FIG. 2 shows the rectifier 40 viewed along the axial direction of the rotating shaft 12 from the rear cover 25 side.

As shown in FIG. 2, the rectifier 40 includes a first heat sink (or heat dissipation plate) 41A, a second heat sink 41B, a plurality (more particularly, six in the present embodiment) of first rectifying elements 50A mounted to the first heat sink 41A, a plurality (more particularly, six in the present embodiment) of second rectifying elements 50B mounted to the second heat sink 41B, and a terminal block 43. The first heat sink 41A and the second heat sink 41B are located to overlap each other in the axial direction of the rotating shaft 12. Moreover, the second heat sink 41B is located closer than the first heat sink 41A to the frame member 20 (i.e., located on the front side of the first heat sink 41A). The configuration of the rectifier 40 will be described in detail later.

In addition, hereinafter, the first heat sink 41A and the second heat sink 41B will be together simply referred to as the heat sinks 41; the first rectifying elements 50A and the second rectifying elements 50B will be together simply referred to as the rectifying elements 50.

The rear cover 25 is made, for example, of an electrically-insulative synthetic resin. As shown in FIG. 1, the rear cover 25 is arranged to cover the rectifier 40 from the rear side. In the rear cover 25, there are formed a plurality of ventilation holes 26 through which cooling air is sucked into the rotating electric machine 10 with rotation of the cooling fans 15 and 16. In addition, as indicated with the dashed-line arrow in FIG. 1, the cooling air sucked into the rotating electric machine 10 flows to the frame member 20 while cooling the heat sinks 41 of the rectifier 40.

As described previously, in the present embodiment, the stator 13 includes a pair of three-phase stator coils 18. Accordingly, in the rectifier 40, there are formed a pair of rectification circuits 30 respectively corresponding to the pair of three-phase stator coils 18.

FIG. 3 shows the configuration of each of the rectification circuits 30 formed in the rectifier 40.

In addition, the rectification circuits 30 have the same configuration; therefore, only one of the rectification circuits 30 is shown in FIG. 3.

As shown in FIG. 3, in the present embodiment, each of the rectification circuits 30 is configured to full-wave rectify alternating current generated in a corresponding one of the stator coils 18 of the stator 13. More specifically, each of the rectification circuits 30 is configured as a three-phase (i.e., U, V and W phases) bridge circuit having an upper arm 31 and a lower arm 32. The upper arm 31 is constituted of three first rectifying elements 50A. The lower arm 32 is constituted of three second rectifying elements 50B.

Moreover, in the present embodiment, each of the stator coils 18 includes three phase windings that are Y-connected to define a neutral point therebetween. In each of the rectification circuits 30, each of the first rectifying elements 50A and the second rectifying elements 50B is electrically connected to an end of a corresponding one of the three phase windings of the corresponding stator coil 18.

It should be noted that the three phase windings of each of the stator coils 18 may alternatively be Δ-connected.

Figure 4:
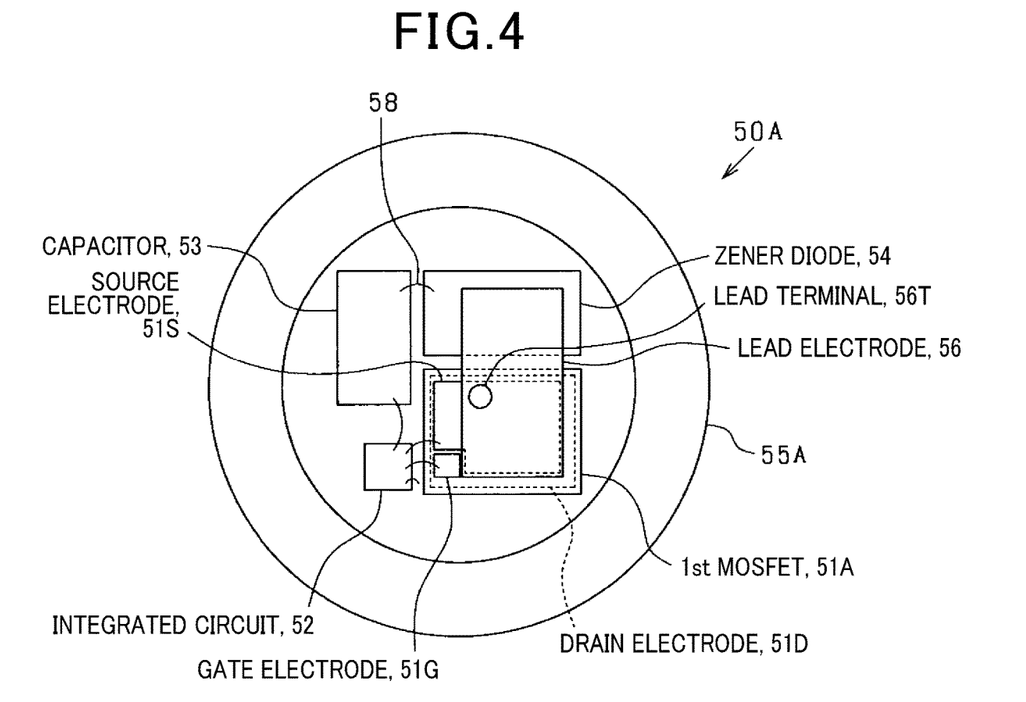
FIG. 4 is a plan view of one of first rectifying elements of the rectifier.
Figure 5:
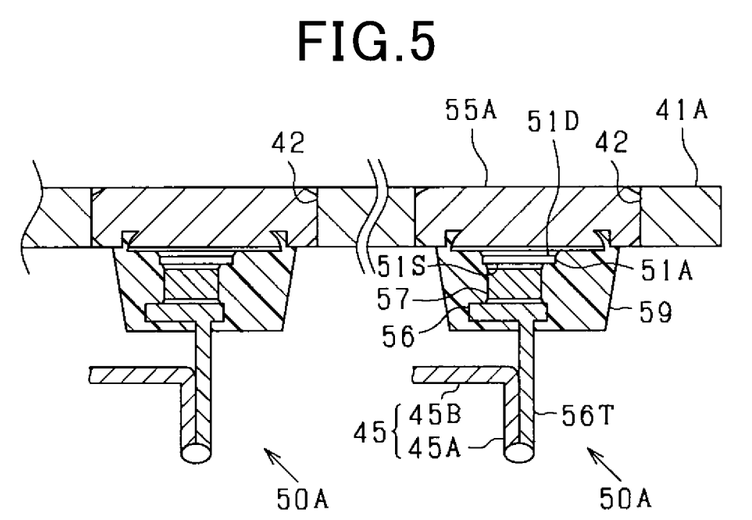
FIG. 5 is a schematic cross-sectional view of a first heat sink to which the first rectifying elements of the rectifier are mounted.
Figure 6:
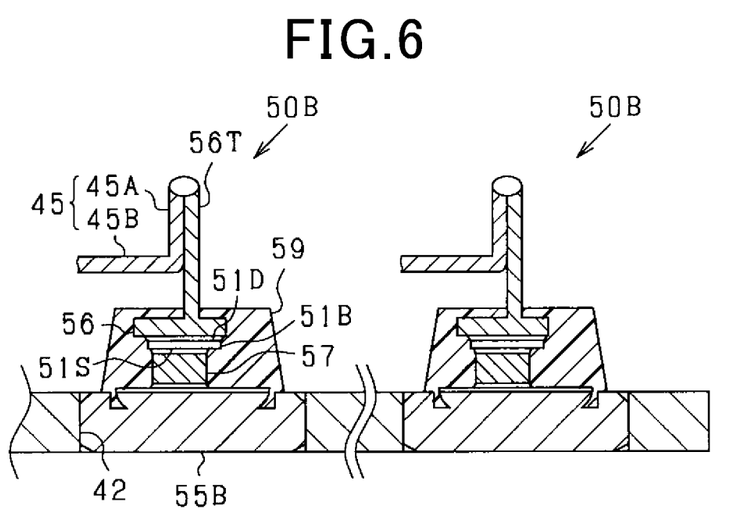
FIG. 6 is a schematic cross-sectional view of a second heat sink to which second rectifying elements of the rectifier are mounted.

As shown in FIGS. 3-5, each of the first rectifying elements 50A includes a first MOSFET (Metal-Oxide-Semi-conductor Field-Effect Transistor) 51A, a control IC (Integrated Circuit) 52, a capacitor 53 and a Zener diode 54. Similarly, as shown in FIGS. 3 and 6, each of the second rectifying elements 50B includes a second MOSFET 51B, a control IC 52, a capacitor 53 and a Zener diode 54.

It should be noted that for the sake of simplicity, in FIG. 3, only one of the first rectifying elements 50A and only one of the second rectifying elements 50B have their components designated by the respective reference numerals. In addition, hereinafter, the first MOSFETs 51A of the first rectifying elements 50A and the second MOSFETs 51B of the second rectifying elements 50B will be together simply referred to as the MOSFETs 51 of the rectifying elements 50.

In the present embodiment, each of the MOSFETs 51 of the rectifying elements 50 is implemented by an n-type MOSFET.

In each of the rectifying elements 50, the control IC 52 is connected between the drain and source of the MOSFET 51 so as to be parallel to the MOSFET 51. Moreover, the control IC 52 is also connected to the gate of the MOSFET 51. The control IC 52 applies a voltage to the gate of the MOSFET 51, thereby controlling the ON/OFF of the MOSFET 51. In addition, to the control IC 52, there is connected the capacitor 53 that functions as a power source of the control IC 52.

The Zener diode 54, which functions as a surge absorbing element, is connected in parallel to the MOSFET 51. More specifically, the Zener diode 54 has its cathode connected to the drain of the MOSFET 51 and its anode connected to the source of the MOSFET 51. In addition, the Zener diode 54 may be omitted from the rectifying element 50.

In the present embodiment, each of the rectifying elements 50 has two terminals. Therefore, each of the rectification circuits 30 formed in the rectifier 40 may have the same configuration as a conventional rectification circuit that employs diodes as rectifying elements. Specifically, each of the first rectifying elements 50A has its low-potential terminal connected to a corresponding one of the three phase windings of the corresponding stator coil 18 and its high-potential terminal connected to an output terminal B of the rotating electric machine 10. Moreover, to the output terminal B, there are connected a battery and electrical loads provided on the vehicle. On the other hand, each of the second rectifying elements 50B has its high-potential terminal connected to a corresponding one of the three phase windings of the corresponding stator coil 18 and its low-potential terminal grounded.

During operation of the rotating electric machine 10, in each of the rectification circuits 30, for each of the three phase windings of the corresponding stator coil 18, the pair of the first and second MOSFETs 51A and 51B corresponding to (i.e., connected with) the phase winding are turned on in a complementary manner. Moreover, according to the power generation in each of the three phase windings of the corresponding stator coil 18, the pairs of the first and second MOSFETs 51A and 51B respectively corresponding to the phase windings of the corresponding stator coil 18 are sequentially turned on. Consequently, the three-phase alternating current generated in the corresponding stator coil 18 is rectified by the rectification circuit 30 into direct current.

Next, the structures of the rectifying elements 50 will be described with reference to FIGS. 4-6.

FIG. 4 is a plan view of one of the first rectifying elements 50A, omitting a resin member 59 covering the first rectifying element 50A. FIG. 5 is a schematic cross-sectional view of the first heat sink 41A to which the first rectifying elements 50A are mounted. FIG. 6 is a schematic cross-sectional view of the second heat sink 41B to which the second rectifying elements 50B are mounted.

It should be noted that for the sake of simplicity, in each of FIGS. 5 and 6, only one of the rectifying elements 50 (i.e., 50A or 50B) has its components designated by the respective reference numerals. It also should be noted that for the sake of simplicity, in each of FIGS. 5 and 6, the control ICs 52, capacitors 53 and electric wires 58 of the rectifying elements 50 are not shown.

As shown in FIGS. 4 and 5, each of the first rectifying elements 50A includes a high-potential base electrode 55A, a lead electrode 56 and a block electrode 57 in addition to the first MOSFET 51A, the control IC 52, the capacitor 53 and the Zener diode 54. The block electrode 57 corresponds to an "electrically-conductive spacer" in the claims.

Similarly, as shown in FIG. 6, each of the second rectifying elements 50B includes a ground-potential base electrode 55B, a lead electrode 56 and a block electrode 57 in addition to the second MOSFET 51B, the control IC 52, the capacitor 53 and the Zener diode 54. The block electrode 57 corresponds to an "electrically-conductive spacer" in the claims.

In addition, hereinafter, the high-potential base electrodes 55A of the first rectifying elements 50A and the ground-potential base electrodes 55B of the second rectifying elements 50B will be together simply referred to as the base electrodes 55 of the rectifying elements 50. The first rectifying elements 50A differ from the second rectifying elements 50B only in the manner of connection. Therefore, the common features of the first rectifying elements 50A and the second rectifying elements 50B will be described only once.

In each of the rectifying elements 50, the base electrode 55 has a circular shape in plan view and is made of an electrically-conductive metal. As shown in FIGS. 5 and 6, the base electrode 55 is press-fitted in a corresponding one of mounting holes 42 formed in the corresponding heat sink 41. The base electrode 55 has an outer diameter equal to or slightly greater than an inner diameter of the corresponding mounting hole 42. Moreover, the base electrode 55 has a height (or axial dimension) equal to the thickness of the corresponding heat sink 41.

On the base electrode 55, there are arranged the MOSFET 51, the control IC 52, the capacitor 53 and the Zener diode 54, which are electrically connected via the electric wires 58.

As shown in FIGS. 3 and 4, the MOSFET 51 is formed into, for example, a rectangular chip. Moreover, the MOSFET 51 has a vertical structure where a source electrode 51S and a drain electrode 51D are respectively located on opposite major faces of the MOSFET 51. More specifically, on one of the major faces of the MOSFET 51, there are provided both the source electrode 51S and a gate electrode 51G; on the other of the major faces, there is provided the drain electrode 51D. The gate electrode 51G of the MOSFET 51 is electrically connected to the control IC 52 via one of the electric wires 58.

On the opposite side of the MOSFET 51 and the Zener diode 54 to the base electrode 55, there is provided the lead electrode 56. The lead electrode 56 has a plate-shaped part connected with both the MOSFET 51 and the Zener diode 54 and a cylindrical lead terminal 56T. Moreover, as shown in FIGS. 5 and 6, the base electrode 55 and all the components provided on the base electrode 55 are covered with a resin member 59, with the lead terminal 56T of the lead electrode 56 protruding outside the resin member 59. In addition, as shown in FIG. 4, when viewed along the axial direction of the rotating shaft 12 (i.e., the direction perpendicular to the paper surface of FIG. 4), the lead terminal 56T of the lead electrode 56 is located substantially at the center of the base electrode 55.

In the present embodiment, in each of the first rectifying elements 50A, as shown in FIGS. 4 and 5, the drain electrode 51D of the first MOSFET 51A is connected and fixed to the high-potential base electrode 55A by soldering. Moreover, a cathode electrode of the Zener diode 54 is also connected and fixed to the high-potential base electrode 55A by soldering. In addition, the high-potential base electrode 55A corresponds to the high-potential terminal of the first rectifying element 50A.

On the other hand, the source electrode 51S of the first MOSFET 51A is connected and fixed to the lead electrode 56 via the block electrode 57. More specifically, as shown in FIG. 4, part of the source electrode 51S is narrowed for providing the gate electrode 51G on the source electrode 51S-side major face of the first MOSFET 51A. The source electrode 51S except for the narrowed part thereof is connected and fixed to the block electrode 57 by soldering. Moreover, an anode electrode of the Zener diode 54 is also connected and fixed to the block electrode 57 by soldering. Furthermore, the block electrode 57 is connected and fixed to the lead electrode 56 by soldering. In addition, the lead electrode 56 corresponds to the low-potential terminal of the first rectifying element 50A.

It should be noted that the first MOSFET 51A and the Zener diode 54 may alternatively be directly connected and fixed to the lead electrode 56 without providing the terminal electrode 57 between the lead electrode 56 and the first MOSFET 51A and the Zener diode 54.

In each of the second rectifying elements 50B, as shown in FIG. 6, the drain electrode 51D of the second MOSFET 51B is connected and fixed to the lead electrode 56 by soldering. Moreover, a cathode electrode of the Zener diode 54 is also connected and fixed to the lead electrode 56 by soldering. In addition, the lead electrode 56 corresponds to the high-potential terminal of the second rectifying element 50B.

On the other hand, an anode electrode of the Zener diode 54 is connected and fixed to the block electrode 57 by soldering. Moreover, the source electrode 51S of the second MOSFET 51B is connected and fixed to the ground-potential base electrode 55B via the block electrode 57. More specifically, part of the source electrode 51S is narrowed for providing the gate electrode 51G on the source electrode 51S-side major face of the second MOSFET 51B. The source electrode 51S except for the narrowed part thereof is connected and fixed to the block electrode 57 by soldering. The block electrode 57 is provided so as not to interfere with the gate electrode 51G. Consequently, the block electrode 57 is prevented from affecting electrical connection between the gate electrode 51G and the control IC 52. Furthermore, the block electrode 57 is connected and fixed to the ground-potential base electrode 55B by soldering. In addition, the ground-potential base electrode 55B corresponds to the low-potential terminal of the second rectifying element 50B.

Connecting the MOSFET 51 and the Zener diode 54 between the base electrode 55 and the lead electrode 56 in each of the rectifying elements 50 in the above-described manner, the heat dissipation performance of the MOSFET 51 differs between the first rectifying elements 50A and the second rectifying elements 50B. This is because the manner of connecting the MOSFET 51 to the base electrode 55 mounted to the corresponding heat sink 41 differs between the first rectifying elements 50A and the second rectifying elements 50B. More specifically, in each of the first rectifying elements 50A, the first MOSFET 51A is directly connected and fixed to the high-potential base electrode 55A. In contrast, in each of the second rectifying elements 50B, the second MOSFET 51B is connected and fixed to the ground-potential base electrode 55B via the block electrode 57. Moreover, due to the gate terminal 51G provided on the source electrode 51S-side major face of the second MOSFET 51B, the connection area between the block electrode 57 and the second MOSFET 51B becomes smaller than the area of each of the major faces of the second MOSFET 51B as well as than the surface area of the drain electrode 51D. Consequently, the heat dissipation performance of the second MOSFET 51B in each of the second rectifying elements 50B becomes lower than the heat dissipation performance of the first MOSFET 51A in each of the first rectifying elements 50A.

The maximum operation-guaranteed temperature of the MOSFETs 51 is lower than that of diodes. Moreover, unlike diodes, the MOSFETs 51 hardly generate heat during operation. Therefore, the temperatures of those MOSFETs 51 which are arranged close to the machine main body 14 (or located on the frame member 20 side) may be lower than the temperature of the frame member 20. However, the heat of the machine main body 14 and the frame member 20 may be transferred to the frame member 20-side MOSFETs 51, i.e., to the second MOSFETs 51B of the second rectifying elements 50B, causing the temperatures of the second MOSFETs 51B to exceed the maximum operation-guaranteed temperature thereof. That is, since the second rectifying elements 50B, which are structured so that the heat dissipation performance of the second MOSFETs 51B is low, are arranged on the frame member 20 side, the temperatures of the second MOSFETs 51B may be increased to exceed the maximum operation-guaranteed temperature thereof.

In addition, each of the MOSFETs 51 of the rectifying elements 50 may alternatively be implemented by a p-type MOSFET. In this case, it is possible to arrange the first rectifying elements 50A, in each of which the first MOSFET 51A is directly connected fixed to the high-potential base electrode 55A, on the frame member 20 side. However, p-type MOSFETs are less widely used and have lower reliability than n-type MOSFETs. Therefore, it is not preferable to employ p-type MOSFETs as the MOSFETs 51 of the rectifying elements 50.

In view of the above, in the present embodiment, the structure of the rectifier 40 is improved so as to improve the heat dissipation efficiency of the second heat sink 41B.

Hereinafter, the improved structure of the rectifier 40 will be described in detail with reference to FIG. 2. It should be noted that for the sake of simplicity, in FIG. 2, for identical components, only one of them is designated by the reference numeral thereof.

As shown in FIG. 2, the rectifier 40 includes the first heat sink 41A to which the six first rectifying elements 50A are mounted, the second heat sink 41B to which the six second rectifying elements 50B are mounted, and the terminal block 43 in which are provided connecting members 44 for connecting the pair of three-phase stator coils 18 of the stator 13 to the corresponding rectifying elements 50.

Each of the heat sinks 41 is made of an electrically-conductive metal plate having high heat conductivity. Moreover, to prevent interference with the rotating shaft 12 and secure a sufficient heat dissipation area, each of the heat sinks 41 is arc-shaped and arranged around the rotating shaft 12. In other words, the heat sinks 41 are respectively shaped in two circular rings that are partially cut out in substantially the same angular range (or circumferential range).

In each of the heat sinks 41, there are formed six mounting holes 42 in which the corresponding rectifying elements 50 are respectively mounted. The six mounting holes 42 are arranged in the circumferential direction.

Each of the mounting holes 42 is formed at a radial center position (or a center position in the width direction) of the heat sink 41. Moreover, each of the mounting holes 42 is formed to penetrate the heat sink 41 in the thickness direction thereof (or in the axial direction of the rotating shaft 12).

It should be noted that each of the mounting holes 42 may alternatively be formed to be offset from the radial center position of the heat sink 41.

In the mounting holes 42, there are respectively press-fitted the base electrodes 55 of the corresponding rectifying elements 50. Consequently, the base electrodes 55 of the corresponding rectifying elements 50 are electrically connected with each other via the heat sink 41.

In the first heat sink 41A, there is formed the output terminal B of the rotating electric machine 10 at a circumferential end of the arc-shaped first heat sink 41A. On the other hand, the second heat sink 41B is electrically connected to the frame member 20 and thus grounded via the frame member 20.

The terminal block 43 is made of a synthetic resin and arranged between the first heat sink 41A and the second heat sink 41B. The terminal block 43 is formed by insert-molding to have each of the electrically-conductive connecting members 44 partially inserted therein.

As shown in FIG. 2, the terminal block 43 has three trapezoidal portions protruding radially outward from the first heat sink 41A. In each of the trapezoidal portions, there is provided a corresponding one of the connecting members 44. The corresponding connecting member 44 has a connecting portion 44A electrically connected with a corresponding one of the stator coils 18 (not shown in FIG. 2). Moreover, the corresponding connection portion 44 also has a pair of connection terminals 45 respectively electrically connected with the lead electrodes 56 of one circumferentially-adjacent pair of the second rectifying elements 50B. That is, in the terminal block 43, there are provided three connecting members 44 that protrude radially outward from the first heat sink 41A and electrically connect the three pairs (or six) of the second rectifying elements 50B to the stator coils 18 of the stator 13.

Moreover, in the terminal block 43, there are also provided connecting members 44 that are located behind the first heat sink 41A and thus not shown in FIG. 2. These connecting members 44 electrically connect the six first rectifying elements 50A to the stator coils 18 of the stator 13. In addition, though not shown in the figures, these connecting members 44 have substantially the same configuration as the connecting members 44 electrically connecting the second rectifying elements 50B to the stator coils 18.

Figure 7:
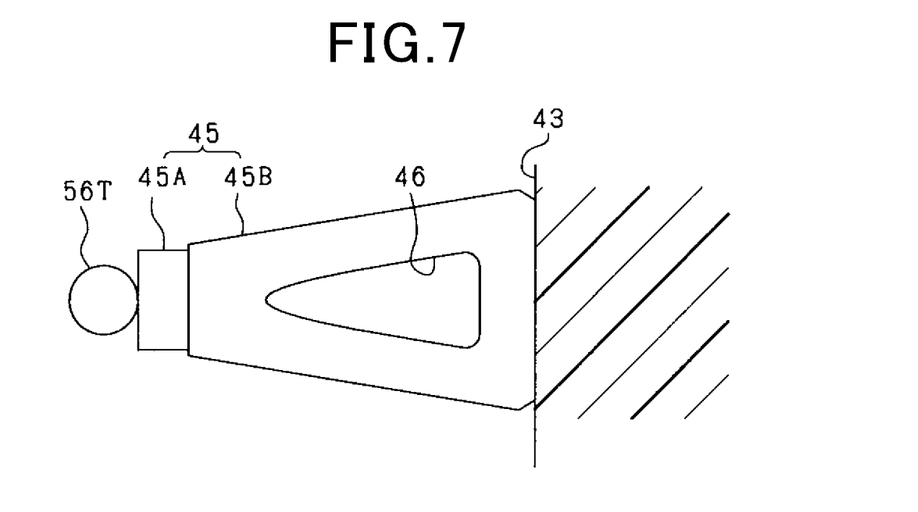
FIG. 7 is a plan view of one of connection terminals of connecting members provided in a terminal block of the rectifier.

As shown in FIGS. 5-7, each of the connection terminals 45 of the connecting members 44 is formed by bending a plate-shaped member at a right angle. That is, each of the connection terminals 45 has a first part 45A connected with the lead terminal 56T of the lead electrode 56 of the corresponding rectifying element 50 and a second part 45B that extends perpendicular to the first part 45A to connect the first part 45A to a main body of the connecting member 44.

As shown in FIG. 7, the first part 45A has a width greater than the outer diameter of the lead terminal 56T of the lead electrode 56. The first part 45A is arranged along and joined (e.g., by welding) to a distal end part of the lead terminal 56T of the lead electrode 56.

On the other hand, as shown in FIGS. 5 and 6, the second part 45B extends parallel to the corresponding heat sink 41. Moreover, as shown in FIG. 7, the second part 45B has a trapezoidal shape in plan view. That is, the width of the second part 45B gradually decreases from the main body of the connecting member 44 provided in the terminal block 43 to the first part 45A. The second part 45B has a triangular cooling hole 46 formed at the center thereof. The cooling hole 46 penetrates the second part 45B in the thickness direction thereof (or in the axial direction of the rotating shaft 12 as can be seen from FIG. 2). Consequently, the connection terminal 45 can be cooled by cooling air flowing through the cooling hole 46, thereby improving the heat dissipation performance of the connection terminal 45. In addition, the cooling hole 46 corresponds to a "cooling part" in the claims.

In particular, as shown in FIG. 1, in the rotating electric machine 10, there are no obstacles impeding the flow of the cooling air between the second rectifying elements 50B and the rear cover 25. Therefore, it is particularly easy for the connection terminals 45 connected with the lead electrodes 56 of the second rectifying elements 50B to be cooled by the cooling air flowing through the respective cooling holes 46.

It should be noted that each of the connection terminals 45 connected with the lead electrodes 56 of the first rectifying elements 50A may have no cooling hole 46 formed therein.

As shown in FIGS. 1 and 2, the first and second heat sinks 41A and 41B are arranged to overlap each other in the axial direction of the rotating shaft 12. An imaginary circle O1 that extends through the centers of the first rectifying elements 50A mounted to the first heat sink 41A has a smaller diameter than an imaginary circle O2 that extends through the centers of the second rectifying elements 50B mounted to the second heat sink 41B. That is, the imaginary circle O1 is located radially inside the imaginary circle O2. Moreover, the imaginary circle O2 is located radially outside a radially outer periphery of the first heat sink 41A. That is, part of the second heat sink 41B protrudes radially outward from the first heat sink 41A. Furthermore, a radial width R2 of the second heat sink 41B is set to be greater than a radial width R1 of the first heat sink 41A. Consequently, the surface area of the second heat sink 41B becomes greater than the surface area of the first heat sink 41A.

Moreover, a radial distance L2 from each of the second rectifying elements 50B to a radially outer edge of the second heat sink 41B is set to be greater than a radial distance L1 from each of the first rectifying elements 50A to a radially outer edge of the first heat sink 41A. Here, the radial distance L2 represents the minimum distance from each of the second rectifying elements 50B to the radially outer edge of the second heat sink 41B; the radial distance L1 represents the minimum distance from each of the first rectifying elements 50A to the radially outer edge of the first heat sink 41A.

Setting the radial distance L2 as above, it is possible to extend that radially outer part of the second heat sink 41B which does not overlap the first heat sink 41A, thereby increasing the area of the second heat sink 41B directly exposed to the cooling air.

As described above, the radial width R1 of the first heat sink 41A is set so small as not to completely shield the second heat sink 41B. Consequently, the surface area of the first heat sink 41A becomes small. Therefore, to secure the heat dissipation performance of the first heat sink 41A, there are formed heat dissipation ribs 47 in the first heat sink 41A.

Specifically, as shown in FIG. 2, some of the heat dissipation ribs 47 are formed to radially extend across the rear cover 25-side major face of the first heat sink 41A. The other heat dissipation ribs 47 are formed to protrude radially inward from the radially inner edge of the first heat sink 41A or radially outward from the radially outer edge of the first heat sink 41A.

Consequently, with the heat dissipation ribs 47 formed in the first heat sink 41A, it becomes possible to reduce the area of the first heat sink 41A overlapping the second heat sink 41B while securing the heat dissipation performance of the first heat sink 41A.

Moreover, as shown in FIG. 2, some of the heat dissipation ribs 47 are formed to axially overlap the second heat sink 41B, but none of the second rectifying elements 50B.

Consequently, with the above formation of the heat dissipation ribs 47, it becomes possible to prevent the heat dissipation ribs 47 from interfering with the second rectifying elements 50B and from affecting the heat dissipation of the second rectifying elements 50B via the connection terminals 45.

In the present embodiment, the second rectifying elements 50B, which are structured so that the heat dissipation performance of the second MOSFETs 51B is low, are arranged on the frame member 20 side where the temperature is relatively high. In view of the above, the surface area of the second heat sink 41B is set to be greater than the surface area of the first heat sink 41A, thereby allowing part of the second heat sink 41B to be directly exposed to the cooling air and thus improving the heat dissipation efficiency of the second heat sink 41B. Consequently, it becomes easy for the heat of the second rectifying elements 50B to be dissipated on the ground-potential base electrode 55B side. Moreover, with the cooling holes 46 formed in the connection terminals 45 connected with the lead electrodes 56 of the second rectifying elements 50B, it becomes possible for the heat of the second rectifying elements 50B to be dissipated on the lead electrode 56 side as well as on the ground-potential base electrode 55B side. As a result, it becomes possible to improve the heat dissipation efficiency of the second rectifying elements 50B, thereby allowing the second MOSFETs 51B to normally operate at temperatures lower than the maximum operation-guaranteed temperature thereof. Furthermore, with the heat dissipation ribs 47 formed in the first heat sink 41A, it becomes possible to reduce the area of the first heat sink 41A overlapping the second heat sink 41B while securing the heat dissipation performance of the first heat sink 41A and thereby allowing the heat of the first rectifying elements 50A to be reliably dissipated.

According to the present embodiment, it is possible to achieve the following advantageous effects.

In the rectification circuits 30 of the rotating electric machine 10, the rectifying elements 50 that include the MOSFETs 51 are employed instead of diodes. The maximum operation-guaranteed temperature of the MOSFETs 51 is lower than that of diodes. Therefore, it is desirable to improve the heat dissipation efficiency of the rectifying elements 50. Moreover, due to the arrangement of the heat sinks 41 and the arrangement of the MOSFETs 51 in the respective rectifying elements 50, the heat dissipation performance of the second rectifying elements 50B is considered to be lower than the heat dissipation performance of the first rectifying elements 50A. Moreover, the second heat sink 41B is electrically connected to the frame member 20 and thus grounded via the frame member 20. Accordingly, the second heat sink 41B is located closer than the first heat sink 41A to the frame member 20. Therefore, the heat dissipation performance of the second heat sink 41B is considered to be lower than the heat dissipation performance of the first heat sink 41A.

Moreover, in each of the rectifying elements 50, on one of the major faces of the MOSFET 51, there are provided both the source electrode 51S and the gate electrode 51G; on the other of the major faces, there is provided the drain electrode 51D. In particular, on that side of the MOSFET 51 where both the source electrode 51S and the gate electrode 51G are provided, the block electrode 57 is provided for securing the electrical connection area of the gate electrode 51G. Accordingly, in each of the first rectifying elements 50A, the drain electrode 51D of the first MOSFET 51A is provided on the high-potential base electrode 55A without a block electrode 57 interposed therebetween. In contrast, in each of the second rectifying elements 50B, the source electrode 51S of the second MOSFET 51B is provided on the ground-potential base electrode 55B with the block electrode 57 interposed therebetween. Therefore, the heat dissipation performance of the second rectifying elements 50B is considered to be lower than the heat dissipation performance of the first rectifying elements 50A.

In view of the above, in the present embodiment, the surface area of the second heat sink 41B is set to be greater than the surface area of the first heat sink 41A, thereby improving the heat dissipation efficiency of the second heat sink 41B. Consequently, it becomes possible to effectively dissipate the heat of the second rectifying elements 50B via the second heat sink 41B.

In the present embodiment, to prevent interference with the rotating shaft 12 and secure a sufficient surface area for heat dissipation, each of the heat sinks 41 is arc-shaped. Moreover, the radial width R2 of the second heat sink 41B is set to be greater than the radial width R1 of the first heat sink 41A. Consequently, though the first heat sink 41A and the second heat sink 41B are located to overlap each other in the axial direction of the rotating shaft 12, it is still possible to secure the heat dissipation area of the second heat sink 41B. Moreover, the surface area of the second heat sink 41B becomes greater than the surface area of the first heat sink 41A. As a result, it is possible to reliably improve the heat dissipation efficiency of the second heat sink 41B.

In the present embodiment, part of the second heat sink 41B protrudes radially outward from the first heat sink 41A. Moreover, the radial distance L2 from each of the second rectifying elements 50B to the radially outer edge of the second heat sink 41B is set to be greater than the radial distance L1 from each of the first rectifying elements 50A to the radially outer edge of the first heat sink 41A. Consequently, it becomes possible to extend that radially outer part of the second heat sink 41B which does not overlap the first heat sink 41A, thereby further improving the heat dissipation efficiency of the second heat sink 41B. In addition, the size of that part of the first heat sink 41A which is provided radially outside the first rectifying elements 50A becomes small, thereby avoiding negative consequences such as interference with the second rectifying elements 50B mounted to the second heat sink 41B.

In the present embodiment, the first heat sink 41A has the heat dissipation ribs 47 formed therein. Consequently, with the heat dissipation ribs 47, it becomes possible to reduce the area of the second heat sink 41B shielded by the first heat sink 41A while securing the heat dissipation performance of the first heat sink 41A. Moreover, though the size of that part of the first heat sink 41A which is located radially outside the first rectifying elements 50A becomes small, it is still possible to secure the heat dissipation performance of the first heat sink 41A while preventing the first heat sink 41A from interfering with the second rectifying elements 50B mounted to the second heat sink 41B.

In the present embodiment, each of the second rectifying elements 50B has the lead electrode 56 provided on the opposite side of the second MOSFET 51B to the ground-potential base electrode 55B. Moreover, in the connection terminal 45 connected with the lead electrode 56, there is formed the cooling hole 46 through which the cooling air flows. Consequently, the connection terminal 45 can be cooled by the cooling air, thereby improving the heat dissipation performance thereof. As a result, the heat of the second rectifying element 50B can be transferred to the connection terminal 45 via the lead electrode 56. That is, it becomes possible for the heat of the second rectifying element 50B to be dissipated on the lead electrode 56 side as well as on the ground-potential base electrode 55B side.

While the above particular embodiment has been shown and described, it will be understood by those skilled in the art that various modifications, changes, and improvements may be made without departing from the spirit of the present disclosure.

For example, in the above-described embodiment, each of the connection terminals 45 is configured to have the trapezoidal second part 45B and the triangular cooling hole 46 formed in the second part 45B (see FIG. 7).

Figure 8:
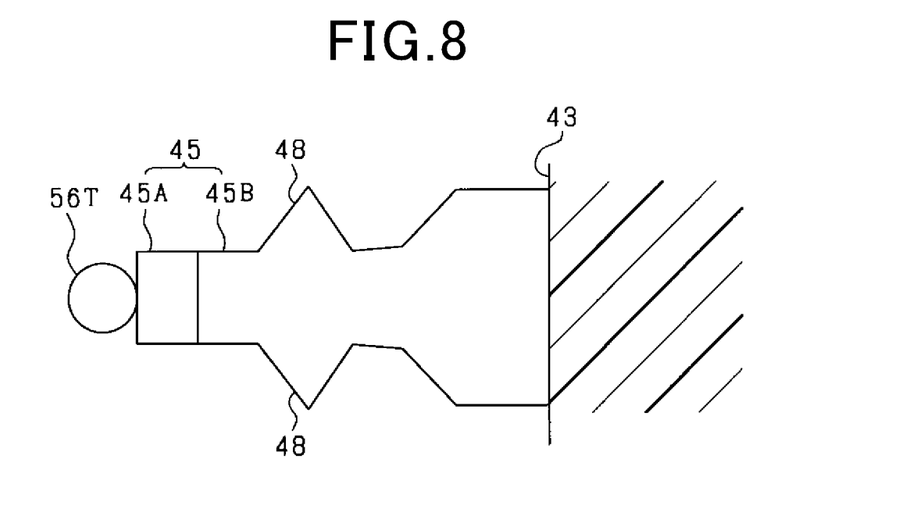
FIG. 8 is a plan view of one of connection terminals of connecting members according to a modification.

As an alternative, as shown in FIG. 8, each of the connection terminals 45 may be configured to have a pair of cooling parts 48 formed to protrude from the second part 45B respectively toward opposite sides in the width direction of the second part 45B. In this case, the cooling parts 48 can be easily exposed to the flow of the cooling air, thereby improving the heat dissipation efficiency of the connection terminal 45.

In the above-described embodiment, each of the heat sinks 41 is arc-shaped. However, each of the heat sinks 41 may alternatively have other shapes, such as a rectangular shape.

What is claimed is:

1. A rotating electric machine comprising:
a machine main body including a rotor and a stator and configured to generate alternating current in the stator with rotation of the rotor;
a frame member holding the machine main body and electrically connected to a grounding member; and
a rectifier provided axially outside the frame member and having a rectification circuit configured to rectify the alternating current generated in the stator into direct current,
wherein
the rectifier includes a first heat sink, a second heat sink, a plurality of first rectifying elements and a plurality of second rectifying elements,
the first and second heat sinks are located to axially overlap each other,
the first rectifying elements are mounted to the first heat sink and constitute an upper arm of the rectification circuit,
the second rectifying elements are mounted to the second heat sink and constitute a lower arm of the rectification circuit,
each of the first rectifying elements includes a high-potential base electrode and a first MOSFET, the high-potential base electrode being fixed to the first heat sink and electrically connected to a high-potential side of the upper arm of the rectification circuit, the first MOSFET having a drain electrode provided on the high-potential base electrode without a spacer interposed therebetween,
each of the second rectifying elements includes a ground-potential base electrode and a second MOSFET, the ground-potential base electrode being fixed to the second heat sink and electrically connected to a ground-potential side of the lower arm of the rectification circuit, the second MOSFET having a source electrode provided on the ground-potential base electrode with an electrically-conductive spacer interposed therebetween,
the second heat sink is located closer than the first heat sink to the frame member, and
a surface area of the second heat sink is greater than a surface area of the first heat sink.

2. The rotating electric machine as set forth in claim 1, wherein each of the first and second heat sinks is arc-shaped,
the first rectifying elements are arranged in a circumferential direction of the first heat sink,
the second rectifying elements are arranged in a circumferential direction of the second heat sink, and
a radial width of the second heat sink is greater than a radial width of the first heat sink.

3. The rotating electric machine as set forth in claim 2, wherein part of the second heat sink protrudes radially outward from the first heat sink, and
a radial distance from each of the second rectifying elements to a radially outer edge of the second heat sink is greater than a radial distance from each of the first rectifying elements to a radially outer edge of the first heat sink.

4. The rotating electric machine as set forth in claim 3, wherein the first heat sink has a plurality of heat dissipation ribs formed to protrude radially outward from the radially outer edge of the first heat sink and axially overlap the second heat sink.

5. The rotating electric machine as set forth in claim 1, further comprising a cover arranged on an opposite axial side of the rectifier to the frame member to cover the rectifier, the cover having a plurality of ventilation holes formed therein,
wherein
the rectifier further includes a terminal block,
each of the second rectifying elements further includes a lead electrode provided on an opposite side of the second MOSFET to the ground-potential base electrode,
the terminal block includes a plurality of connection terminals each of which is provided to electrically connect the lead electrode of a corresponding one of the second rectifying elements to the stator, and
each of the connection terminals has a cooling part configured to be cooled by cooling air flowing into the rotating electric machine through the ventilation holes formed in the cover.

* * * * *